(12) United States Patent
Ryuzaki et al.

(10) Patent No.: US 6,903,445 B2
(45) Date of Patent: Jun. 7, 2005

(54) SEMICONDUCTOR DEVICE HAVING LOW-K INSULATING FILM

(75) Inventors: Daisuke Ryuzaki, Kokubunji (JP); Takeshi Furusawa, Hino (JP)

(73) Assignee: Renesas Technology Corp, Tokyo (JP)

( * ) Notice: Subject to any disclaimer, the term of this patent is extended or adjusted under 35 U.S.C. 154(b) by 0 days.

(21) Appl. No.: 10/896,885

(22) Filed: Jul. 23, 2004

(65) Prior Publication Data

US 2004/0256728 A1 Dec. 23, 2004

Related U.S. Application Data

(62) Division of application No. 10/414,010, filed on Apr. 16, 2003, now Pat. No. 6,777,325.

(30) Foreign Application Priority Data

Apr. 18, 2002 (JP) ........................ 2002-115605

(51) Int. Cl.[7] .......................... H01L 23/48; H01L 23/52; H01L 29/40
(52) U.S. Cl. ...................................... 257/637; 257/760
(58) Field of Search ................... 257/635, 637, 257/642, 736, 759, 760, 783

(56) References Cited

U.S. PATENT DOCUMENTS 4,770,923 A * 9/1988 Wasa et al. ................ 428/212
6,235,648 B1 5/2001 Mizuhara et al.
6,255,732 B1 7/2001 Yokoyama et al.
6,531,714 B1 * 3/2003 Bacchetta et al. ............ 257/77
6,627,532 B1 9/2003 Giallard et al.

FOREIGN PATENT DOCUMENTS

JP  2000-58536  2/2000
JP  2000-106364  4/2000

OTHER PUBLICATIONS

Proceedings of International Interconnect Technology Conference, 1999, pp. 190–192.

* cited by examiner

*Primary Examiner*—Phuc T. Dang
(74) *Attorney, Agent, or Firm*—Mattingly, Stanger, Malur & Brundidge, P.C.

(57) ABSTRACT

Disclosed is a semiconductor device having a dielectric film of a stacked structure, comprising a low dielectric constant film containing silicon, oxygen and carbon a modified layer for the low dielectric constant film containing silicon, oxygen, carbon and fluorine and a dielectric protection film formed successively on a semiconductor substrate, the semiconductor device being manufactured by applying a plasma treatment using a fluorine-containing gas to the surface of an organic siloxane film to form a modified layer and then forming a dielectric protection film, which can improve the adhesivity with the dielectric protection film without increasing the dielectric constant of the organic siloxane film to prevent delamination.

7 Claims, 17 Drawing Sheets

SEMICONDUCTOR DEVICE HAVING LOW-K INSULATING FILM

This is a divisional application of U.S. Ser. No. 10/414,010, filed Apr. 16, 2003, now U.S. Pat. No. 6,777,325.

BACKGROUND OF THE INVENTION

1. Field of the Invention

The present invention relates to a semiconductor device and a manufacturing method thereof and more particularly to a semiconductor device at high integration degree and of high speed operation, and a manufacturing method thereof.

2. Description of the Related Art

In recent years, with a view point of increasing the integration degree and the operation speed of semiconductor devices, decrease in the inter-wiring capacitance has been required. Then, studies have been made vigorously for introducing dielectric films of lower dielectric constant than existent silicon oxide films (dielectric constant: 3.9–4.2) as inter-wiring dielectric films (hereinafter simply referred to as low dielectric constant films).

Typical low dielectric constant films of dielectric constant of 3 or less can include, for example, organic siloxane films, inorganic siloxane films and aromatic organic polymer films. The organic siloxane films contain at least methyl groups ($-CH_3$). Methyl siloxane (MSQ) film and methylate hydrosiloxane (HMSQ) film are typical and methylate hydrosiloxane (HMSQ) film are typical examples. Further, inorganic siloxane films contain no methyl groups and hydrosiloxane (HSQ) films are typical examples.

Porous low dielectric constant films of further lower dielectric constant (dielectric constant; 2.5 or less) have also been studied and, particularly, porous organic siloxane films have often been studied because they are excellent, for example, in moisture resistance, chemical resistance, and mechanical strength.

However, the organic siloxane film involves a problem that adhesivity with a dielectric film at the upper layer is extremely low, which hinders practical application. Problems present in forming existent damascene copper wirings are to be described for the example of an organic siloxane film as an inter-level dielectric film (FIG. 1A to FIG. 2C).

At first, as shown in FIG. 1A, after forming a second inter-level dielectric film 7 on a substrate 21 including semiconductor devices and wirings, an organic siloxane film 8 is formed. The organic siloxane film 8 is generally formed by a spin-on coating method or a CVD (chemical vapor deposition) method. A silicon carbide film, a silicon oxide film or a silicon nitride film is formed to about several tens nanometers as a dielectric protection film 10 on the organic siloxane film 8. The dielectric protection film is formed with an aim of preventing the organic siloxane film 8 from degradation in the subsequent resist removing step by plasma ashing or polishing step for metal films. Successively, after forming a resist mask (not illustrated) on the dielectric protection film 9, first layer wiring trenches 11 are formed by dry etching as shown in FIG. 1B, and the resist mask is removed by plasma ashing. As shown in FIG. 1C, a titanium nitride film or a tantalum nitride film is formed thinly as a barrier metal film 12 and, further, a copper film 13 is formed. Finally, as shown in FIG. 2A, metals other than those in the first layer wiring trenches 11 are removed by a CMP (Chemical Mechanical Polishing) method to form conduction portions such as wirings or inter-level connection.

In the semiconductor device obtained by the procedures described above, since the organic siloxane film 8 of low dielectric constant is used as the inter-wiring dielectric film, the capacitance between wirings can be decreased effectively. However, adhesivity between the organic siloxane film 8 and the dielectric protection film 10 formed thereon is generally poor and delamination tends to occur during a CMP step or the like as shown at a delamination portion 22 in FIG. 2B. Such delamination results in deterioration of the reliability of wirings and lowering of the yield in the wiring steps.

For preventing the delamination failure, it has been studied a method of applying a plasma treatment just after the deposition of the organic siloxane film 8 to form an existent modified layer 23 on the surface thereby improving the adhesivity as shown in FIG. 2C. The modified layer is a layer formed by the plasma treatment on the surface of the organic siloxane film and having a carbon content lower than that of the organic siloxane film. For forming the existent modified layer 23, an oxygen gas has been used most generally as a plasma gas and water, ammonia, nitrogen, argon, hydrogen, helium or neon gas has also been known as other gas.

A method of improving the adhesivity by the plasma treatment using an active gas such as an oxygen gas or a gas mixture of ammonia and nitrogen has been disclosed in "Integration of Low k Methyl Silsesquioxane in a Non-Etchback/CMP Process for 0.25 µm LSI Device" H. D. Joeng, et al., Proceedings of International Interconnect Technology Conference, 1999, pp. 190–192). At the surface of the modified layer formed by the plasma treatment using the active gas described above, the carbon content is decreased to about ⅕ of the carbon content in the organic siloxane film. As described above, since carbon causing that lowers the adhesion strength is decreased, film delamination can be prevented. However, since carbon is greatly decreased in the modified layer, the modified layer has high hygroscopicity. As a result, this results in a problem of increasing the dielectric constant and also increasing the effective capacitance between wirings. It is considered that a similar problem will occur even when water is used as an active gas.

As another example, a method of applying a plasma treatment to the surface of a non-siloxane type organic dielectric film by using an inert gas such as nitrogen, argon, hydrogen, helium or neon, there by improving the adhesivity to the dielectric film on the upper layer has been disclosed JP-A No. 106364/2000. Also in a case of applying the plasma treatment to the organic siloxane film using the inert gas, since the carbon content in the modified layer is decreased greatly, increase of the dielectric constant is inevitable.

Further, a further example of applying the plasma treatment on the surface of the organic siloxane film can include an etchback process. The etchback process is a process of forming a coated type organic siloxane film so as to fill a gap between metal wirings having unevenness and then conducting planarization by etching the organic siloxane film using a fluorocarbon type gas. Such a process is not effective for the improvement of the adhesivity. This is because the fluorocarbon type polymer deposits on the organic siloxane film to rather lower the adhesion strength. In the etchback process, an oxygen gas or an argon gas is usually irradiated for removing the gas fluorocarbon polymer, but the dielectric constant of the organic siloxane film is increased in this case.

A method of lowering the dielectric constant of the organic siloxane film increased by the plasma treatment is disclosed in JP-A No. 58536/2000. In this example, in the resist removing step using oxygen plasmas, the dielectric constant of the organic siloxane film exposed to the sidewall of the hole is increased. Then, the increased dielectric constant is lowered by a plasma treatment using one of a gas mixture of hydrogen and nitrogen, a fluorine gas, or a hexamethyl silazane gas. In this method, since a high reactive oxygen is irradiated to the organic siloxane film, the dielectric constant is increased greatly. Therefore, even if the dielectric constant is lowered by the plasma treatment of using the gas described above, the dielectric constant cannot be recovered to the same value as in the original organic siloxane film.

SUMMARY OF THE INVENTION

The present invention intends to provide a semiconductor device not increasing the dielectric constant of an organic siloxane film when the organic siloxane film is used for the inter-level insulating film, and improving the adhesivity between the organic siloxane film and the dielectric protection film while keeping the effective capacitance lower between the wirings, thereby avoiding the problem of delamination, as well as a manufacturing method thereof.

The foregoing problem can be overcome by forming an dielectric protection film after applying a plasma treatment using a fluorine-containing gas to the surface of the organic siloxane film.

According to this method, a modified layer of high adhesivity and low dielectric constant can be formed on the surface of the organic siloxane film.

The reason why the modified layer has high adhesivity relative to the dielectric protection film in the upper layer includes that the carbon content not lowers adhesivity compared with a not-modified organic siloxane film is decreased, unevenness on the surface is increased by the effect of the plasmas to increase the adhesion area and that active atoms on the surface are increased by the effect of the plasmas to increase chemical bond with atoms that constitute the dielectric protection film.

Further, the reason why the dielectric constant of the modified layer is low also includes that fluorine can prevent intrusion of moisture that causes increase of the dielectric constant and that etching is taken place simultaneously with the modification, so that a layer of high dielectric constant formed on the uppermost surface is removed. Accordingly, the modified layer has a dielectric constant about equal with that of the not modified organic siloxane film.

The modified layer of the invention is characterized by the atomic distribution in the direction of the depth of the organic siloxane film including the modified layer. The modified layer contains silicon, oxygen carbon, and fluorine. Further, the carbon content in the modified layer has such a distribution in the direction of the depth that the concentration is lowered as approaching the dielectric protection film. However, since the dielectric constant is increased if the carbon content is excessively lower, it is desired that the carbon content is not extremely lower compared with that of the organic siloxane film at the interface with the dielectric protection film. A practical carbon content that does not increase the dielectric constant is preferably ¼ or more of the carbon content of the organic siloxane film at the interface with the dielectric protection film.

The organic siloxane film usable in the invention is a low dielectric constant film containing silicon, oxygen and carbon with the dielectric constant of 3 or less and it is preferred that ⅒ or more of silicon by element ratio is contained in order to obtain a practical mechanical strength. It is further preferred that ⅒ or more of carbon to silicon is contained with an aim of decreasing the dielectric constant and at the same time avoiding the moisture absorption. Further, with a view point of chemical stability, it is further preferred that carbon is contained in the form of methyl groups.

A plasma treatment gas that can be used in the invention is a fluorine-containing gas and a typical example can include $NF_3$ (nitrogen trifluoride gas), $SF_6$ (sulfur hexafluoride gas), $F_2$ (fluorine gas), fluorocarbon gas ($C_xH_yF_z$: x, y, z is each an arbitrary integer) as a single species gas or a gas mixture containing at least one of them. However, since a silicon polymer of high dielectric constant and of low adhesivity is deposited when the plasma treatment gas contains silicon, it is preferred that the gas for the plasma treatment does not contain silicon.

Further, since a fluorocarbon polymer film tends to be deposited on the surface of the modified layer when the carbon content in the gas for the plasma treatment is excessive, adhesivity between the modified layer and the dielectric protection film is lowered. Accordingly, a lower carbon content in the plasma treatment gas is preferred and, for obtaining practical adhesivity, the carbon content is preferably at ⅒ or less by atomic ratio based on the amount of fluorine. Further, most of plasma CVD apparatus are connected with $NF_3$ gas as the cleaning gas and by the use of such an apparatus, plasma treatment, and formation of the dielectric film can be attained in one identical reaction chamber. Further, since $NF_3$ gas contains no carbon, fluoro carbon polymer does not deposit on the surface of the modified layer. With the view points described above, it is particularly preferred to use $NF_3$ as the plasma treatment gas.

Typical example of the dielectric protection film usable in the invention can include a silicon carbide (SiC) film, a silicon carbonitride (SiCN) film, a silicon oxide (SiO) film, a silicon oxynitride (SiON) film, a silicon oxycarbide (SiOC) film, a silicon nitride (SiN) film and an aluminum oxide (AlO) film as a single layer film or a stacked film comprising them in combination. In view of the adhesivity with the modified layer of the invention, silicon carbide is particularly excellent. The method of depositing the dielectric protection film can include a plasma CVD method, a thermal CVD method, a sputtering method, and a spin-on coating method with no particular restriction. Further, since the dielectric constant of the dielectric protection film described above is generally higher compared with that of the organic siloxane film, when the dielectric protection film is excessively thick, the capacitance between the wirings cannot be decreased effectively. Accordingly, the thickness of the dielectric protection film is preferably 100 nm or less.

Further, when the dielectric protection film is formed by an aromatic polymer film, high adhesivity can be obtained. For example, in the step of forming wirings, for example, by a dual damascene method, when the organic siloxane film is formed as the dielectric film of the inter-level connection layer, and then the modified layer of the invention is formed and an aromatic polymer film is formed as the dielectric film for the wiring layer, adhesivity between the modified layer and the aromatic polymer film can be improved.

BRIEF DESCRIPTION OF THE DRAWINGS

Preferred embodiments of the present invention will be described in details based on the drawings, wherein.

DESCRIPTION OF THE PREFERRED EMBODIMENTS

The present invention is to be described specifically by way of examples.

Embodiment 1

Figure 1A:
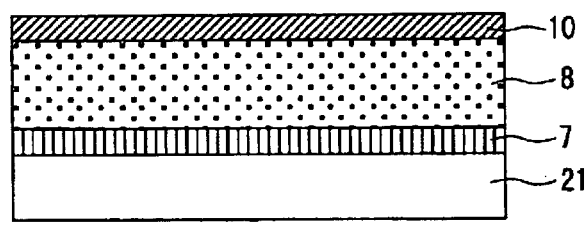
FIG. 1A is a cross sectional view for a main portion for explaining an existent wiring forming step (1)
Figure 1B:
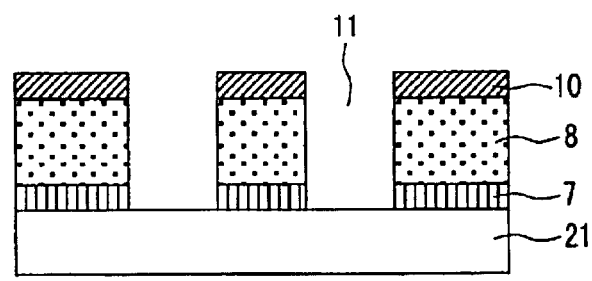
FIG. 1B is a cross sectional view for a main portion for explaining an existent wiring forming step (1)
Figure 1C:
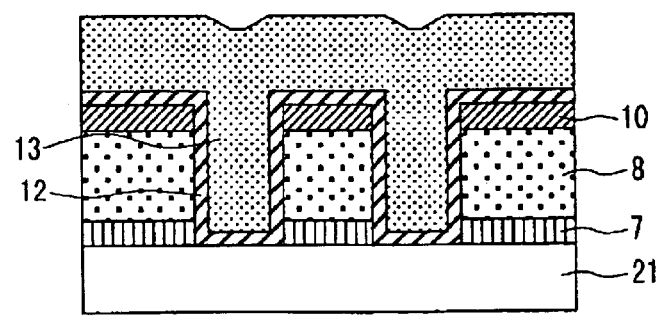
FIG. 1C is a cross sectional view for a main portion for explaining an existent wiring forming step (1)
Figure 2A:
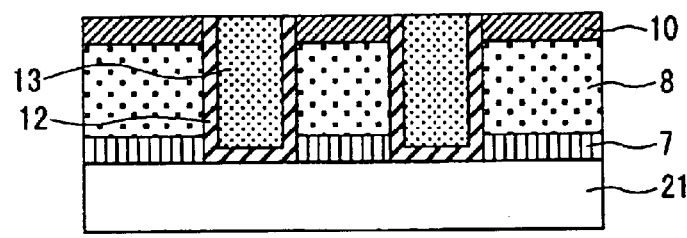
FIG. 2A is a cross sectional view for a main portion for explaining an existent wiring forming step (2)
Figure 2B:
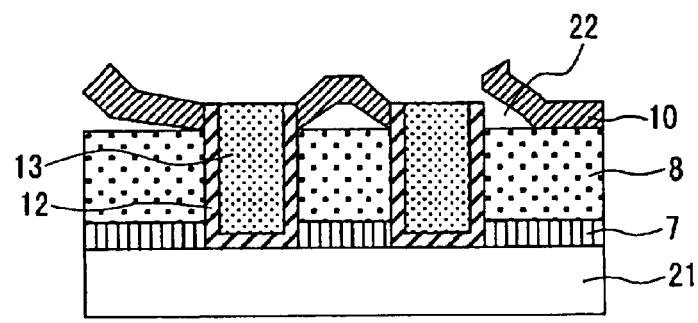
FIG. 2B is a cross sectional view for a main portion for explaining an existent wiring forming step (2)
Figure 2C:
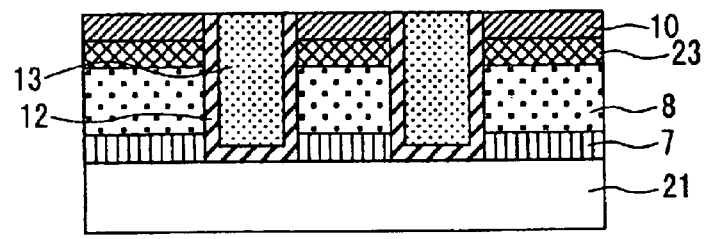
FIG. 2C is a cross sectional view for a main portion for explaining an existent wiring forming step (2)
Figure 3:
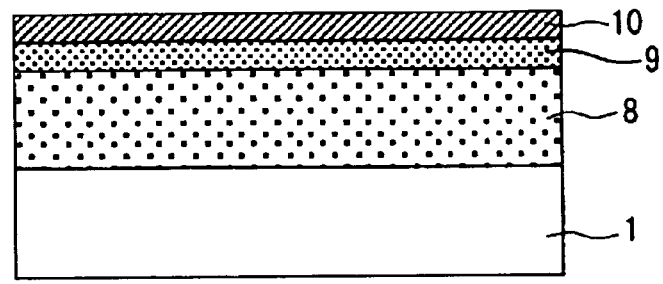
FIG. 3 is a cross sectional view for explaining a stacked structure in Embodiment 1 of the invention.

FIG. 3 shows a cross sectional view of a stacked structure in a first embodiment of the invention. An organic siloxane film 8, a modified layer 9 of the invention and a dielectric protection film 10 are formed in this order on a silicon substrate 1.

As the organic siloxane film 8, LKD manufactured by JSR Co., HSG manufactured by Hitachi Chemical Co., HOSP manufactured by Honeywell Co. obtained by a spin coating method, or Black Diamond manufactured by Applied Materials, Inc. and Coral manufactured by Novellus Systems, Inc. obtained by a CVD method was used. The thickness of the organic siloxane film 8 was 100 to 500 nm.

The modified layer 9 of the invention was formed by a plasma treatment using one of $NF_3$, $SF_6$, $F_2$, $CF_4$, $CHF_3$, $C_2F_6$, or $C_4F_8$, or a plurality of gases mixed together in a plasma CVD apparatus. The conditions for the plasma treatment were gas flow rate of 10 to 2000 sccm, a pressure of 0.1 to 10 Torr, a temperature of 200 to 400° C. and an RF power of 250 to 1500 W.

As the dielectric protection film 10, a silicon carbide film, a silicon nitride film, a silicon oxide film, a silicon oxynitride film, or a silicon carbide film obtained by the plasma CVD method or an aluminum oxide film obtained by a sputtering method or a stacked film thereof was used. The conditions used for the plasma CVD method were at a flow rate of the starting gas of 10 to 2000 sccm, a pressure of 0.1 to 10 Torr, a temperature of 200 to 400° C. and an RF power of 250 to 1500 W. Further, the conditions used for the sputtering were at an argon gas flow rate of 10 to 100 sccm, a pressure of 0.01 to 0.1 Torr, a temperature of 20 to 400° C. and a DC power of 10 to 100 W.

The adhesivity of the dielectric protection film 10 of the stacked structure shown in FIG. 3 was evaluated by a stud pull testing. After fixing a test rod to the surface of the dielectric protection film 10 vertically to the film surface by epoxy adhesives, the test rod was pulled upward. The tension upon delamination of the interface between the dielectric protection film 10 and the modified layer 9 of the invention was defined as an adhesive strength.

Figure 4:
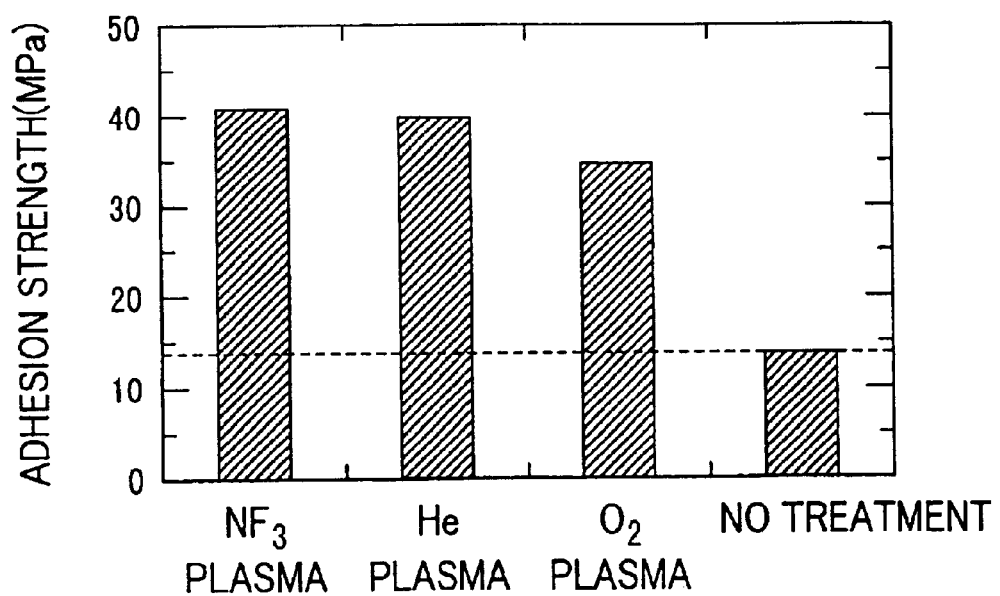
FIG. 4 is a graph showing a relation between a plasma gas for forming a modified layer in Embodiment 1 of the invention and an adhesion strength.

As a typical example, FIG. 4 shows an adhesion strength in a case of using HSG of 200 nm thickness manufactured by Hitachi Chemical Co. (dielectric constant 2.3) as the organic siloxane film 8, an $NF_3$ gas as a gas for the plasma surface treatment and a silicon carbide film of 50 nm thickness as the dielectric protection film 10. In this case, in the stacked structure shown in FIG. 3, the adhesion strength between the dielectric protection film 10 and the modified layer 9 was 41 MPa. Further, for comparison, FIG. 4 also shows the adhesion strength in a case of forming a modified layer on the organic siloxane film 8 by existent plasma treatment by He and $O_2$ gases. As in the invention, when the modified layer was formed by the plasma treatment with the $NF_3$ gas, the adhesion strength was greatest. Further, when an identical experiment was conducted while selecting materials from those described above as the organic siloxane film or the dielectric protection film respectively, the adhesivity was greatest in a case of forming the modified layer by the plasma treatment with the $NF_3$ gas and an adhesion strength of 40 MPa or more was obtained in each of the cases.

Further, an aromatic organic polymer film was formed as the dielectric protection film 8 on the modified layer 9 and the adhesivity of the modified layer 9 and the aromatic organic polymer film was measured in the same manner as described above. For the aromatic organic polymer film, SiLK manufactured by Dow Chemical Co. and FLARE manufactured by Honeywell Co. were used as the aromatic organic polymer film. Also in this case, the adhesivity was the highest in a case of forming the modified layer by the plasma treatment with the $NF_3$ gas and the adhesion strength was 40 MPa.

Figure 5:
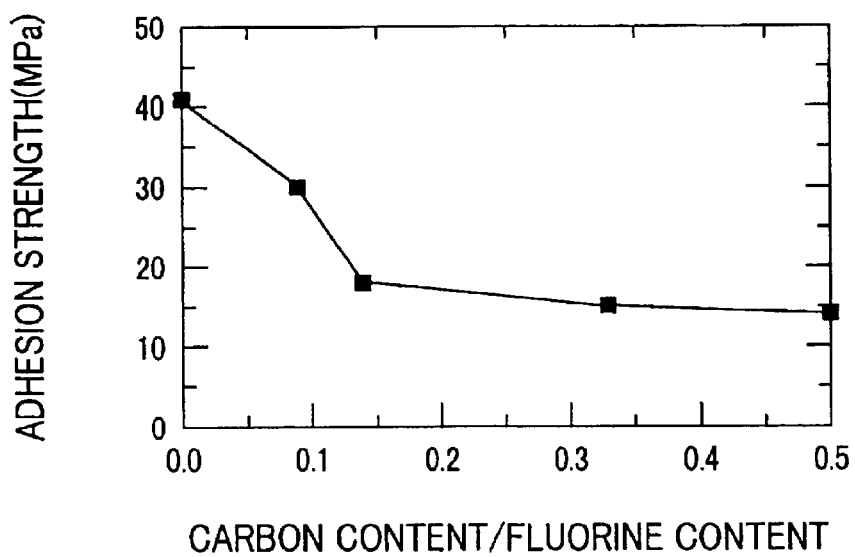
FIG. 5 is a graph showing a relation between a ratio of a carbon content to a fluorine content in a plasma gas for forming a modified layer in Embodiment 1 of the invention and an adhesion strength.

Then, the adhesion strength was examined while changing the mixing ratio of $NF_3$, $SF_6$, $F_2$, $CF_4$, $CHF_3$, $C_2F_6$, and $C_4F_8$ as the gases for the plasma treatment. FIG. 5 shows a relation between the carbon to fluorine content ratio in the plasma treatment gas and the adhesion strength. The adhesion strength was high when the carbon to fluorine content was 1/10 or less and the adhesion strength was low when the carbon content was greater than that described above. This is because of the deposition of a fluorocarbon polymer with less adhesivity on the surface of the modified layer.

Figure 6:
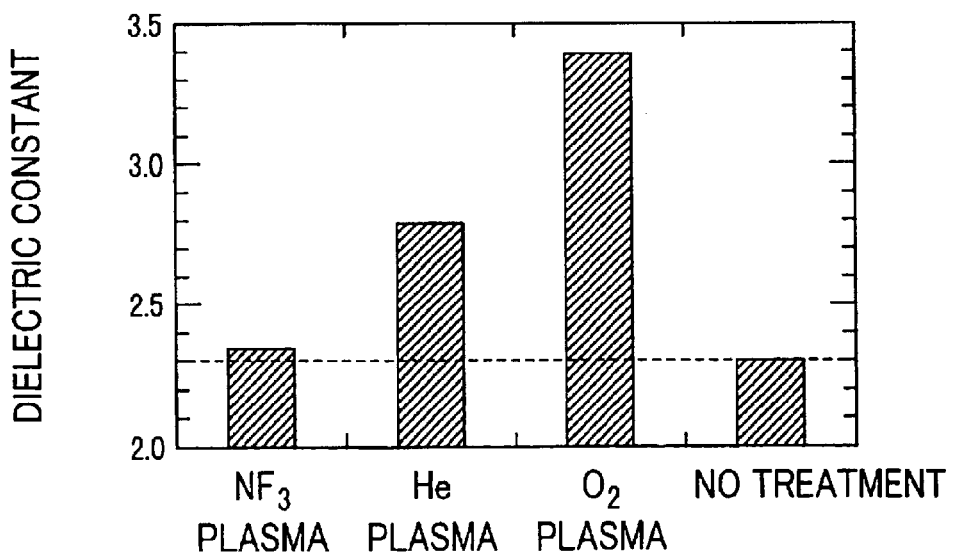
FIG. 6 is a graph showing a relation between a ratio of a carbon content to a fluorine content in a plasma gas for forming a modified layer in Embodiment 1 of the invention a dielectric constant.

The dielectric constant of the organic siloxane film 8 having the stacked structure shown in FIG. 3 was measured. After forming the modified layer 9 of the invention by the $NF_3$ plasma treatment on the organic siloxane film 8 in order to avoid the effect of the dielectric protection film 10, Al was vapor deposited to form an upper electrode. The dielectric constant of the siloxane 8 including that of the modified layer was 2.3 and showed no change compared with the dielectric constant of the organic siloxane film 8 before the plasma treatment. FIG. 6 shows the dielectric constant in a case of forming the modified layer by the plasma treatment with $NF_3$, He, and $O_2$ gases respectively on the organic siloxane film 8 and in a case with no plasma treatment. The dielectric constant showed no change only in the case of forming the modified layer by the plasma treatment with the $NF_3$ gas as in the invention, whereas the dielectric constant increased greatly in a case of using plasma treatment with He and $O_2$ gases.

In the stacked structure shown in FIG. 3, the atomic distribution in the direction of the thickness vertical to the film surface from the surface of the modified layer 9 of the invention was examined by the Auger electron spectroscopy. As a comparison, Auger electron spectroscopy was conducted also in a case of forming an existent modified layer on the organic siloxane film 8 by the plasma treatment with the He or $O_2$ gas and in a case of with no plasma treatment. The analysis was conducted before forming the dielectric protection film 19.

Figure 7A:
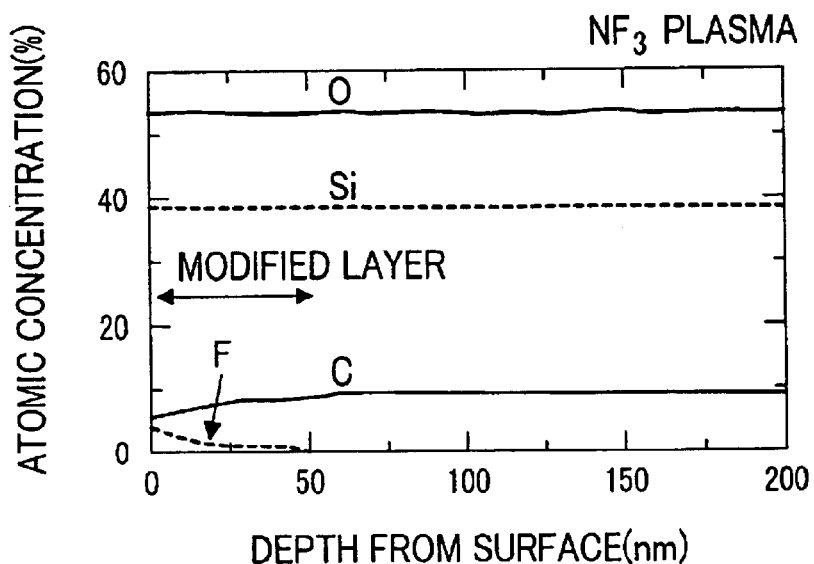
FIG. 7A is a graph (1) showing the result of analysis for atomic distribution of a modified layer in Embodiment 1 of the invention.
Figure 8A:
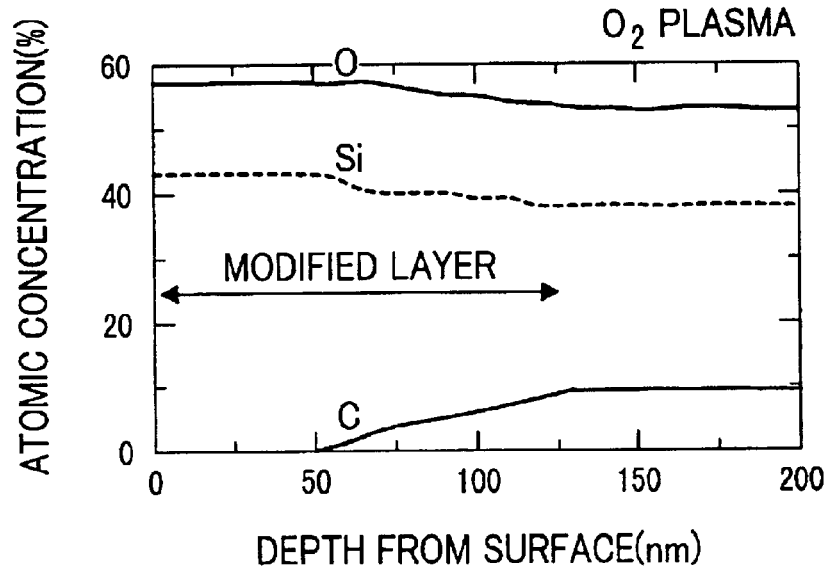
FIG. 8A is a graph (2) showing the result of analysis for atomic distribution of a modified layer in Embodiment 1 of the invention.
Figure 8B:
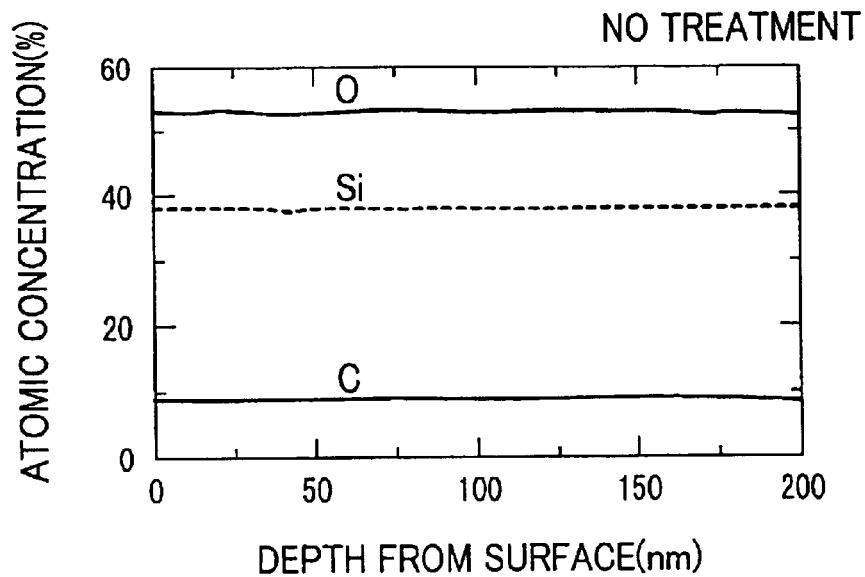
FIG. 8B is a graph (2) showing the result of analysis for atomic distribution of a modified layer in Embodiment 1 of the invention.

As shown in FIG. 7A, when a modified layer was formed by $NF_3$ plasmas, it has been found that the modified layer was formed in a region of about 50 nm from the surface, and that silicon, oxygen, carbon and fluorice were present in the region. In the modified layer, the carbon content decreased continuously as it approached the film surface compared with the state with no treatment (FIG. 8B). In the example of the modified layer formed under the condition described above, the carbon content at the uppermost surface was about ½ of the carbon content of the organic siloxane film 8.

Figure 7B:
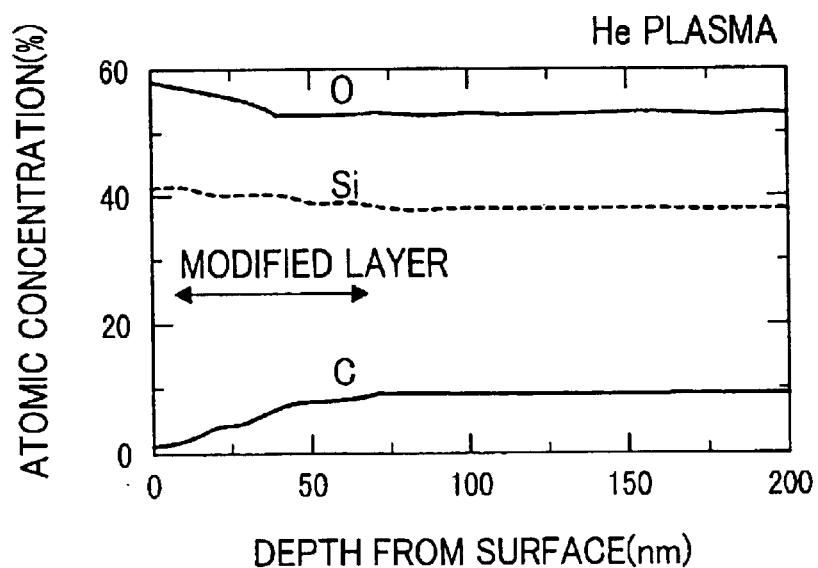
FIG. 7B is a graph (1) showing the result of analysis for atomic distribution of a modified layer in Embodiment 1 of the invention.

On the other hand, in the modified layer by the He plasma treatment (FIG. 7B) or the $O_2$ plasma treatment (FIG. 8A), the carbon content decreased remarkably compared with that in the modified layer by the $NF_3$ plasma treatment. At the uppermost surface of the modified layer, the carbon content decreased to ⅕ (He plasma) or decreased to zero ($O_2$ plasma) compared with the carbon content of the organic siloxane film 8, Further, fluorine was not contained in the existent modified layers. That is, in the modified layer 9 of the invention, increase of the dielectric constant can be suppressed since the decrement of the carbon content is small compared with the existent modified layer and since fluorine is present.

Embodiment 2

Multi-layered wirings of a semiconductor device were prepared by a copper damascene method. Embodiment 2 is to be described with reference to FIGS. 9 to 13.

Figure 9A:
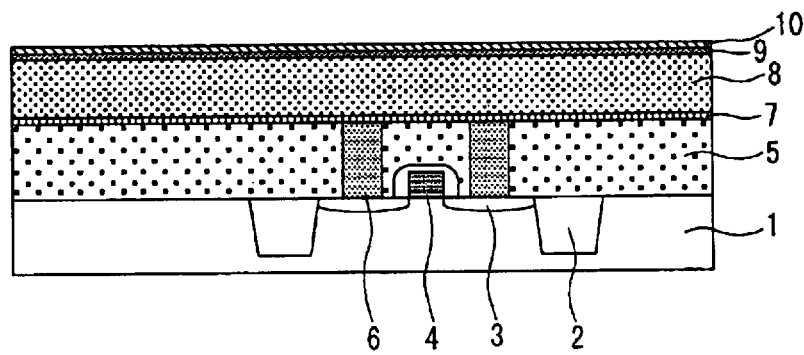
FIG. 9A is a cross sectional view (1) for a main portion for explaining a wiring forming step in Embodiment 2 of the invention.

In FIG. 9A, a transistor comprising an impurity diffusion layer 3 and a gate electrode 4 surrounded with an element isolation structure 2 is present on the surface of a silicon substrate 1. Further, a first inter-level dielectric layer 5 is formed so as to cover the transistor and a contact plug 6 is connected with the impurity diffusion layer 3 for electric conduction with the upper layer.

The first layer wirings were formed by a single damascene method as described below.

After depositing a second inter-level dielectric film 7 of 20 nm thickness as an etching stopper, an organic siloxane film 8 of 200 nm thickness was deposited. Further, a modified layer 9 of the invention was formed on the surface of the organic siloxane film under the condition shown in Embodiment 1. Successively, a dielectric protection film 10 was deposited to 20 nm thickness by a plasma CVD method in an apparatus identical with the plasma apparatus used for forming the modified layer 9.

Figure 9B:
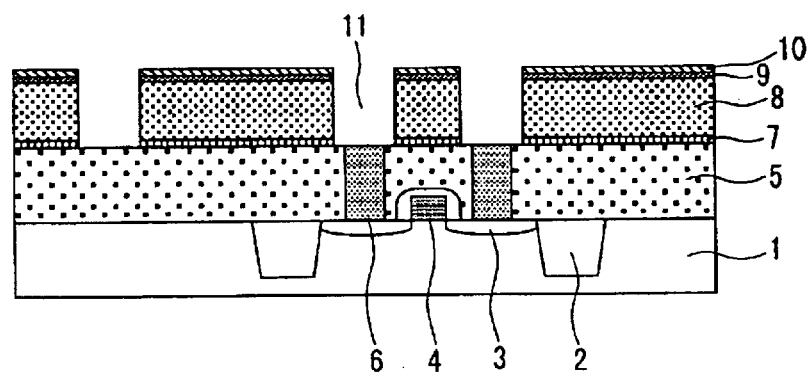
FIG. 9B is a cross sectional view (1) for a main portion for explaining a wiring forming step in Embodiment 2 of the invention.

As shown in FIG. 9B, after forming a resist pattern on the dielectric protection film 10 and forming first layer wiring trenches 11 by dry etching, the resist pattern was removed.

Figure 9C:
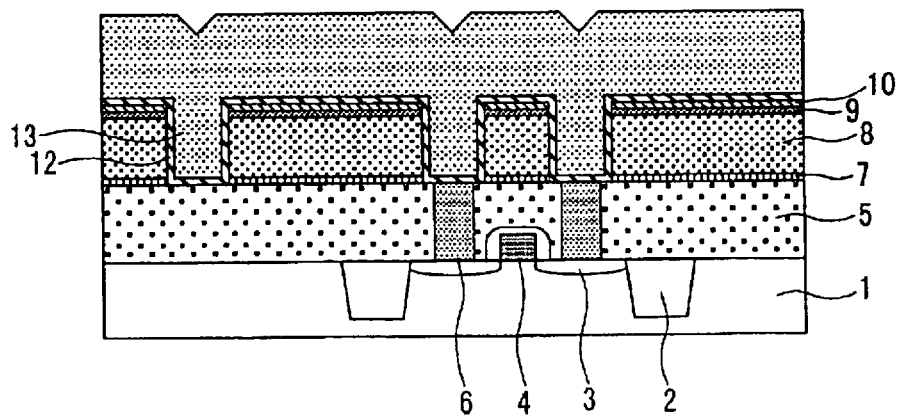
FIG. 9C is a cross sectional view (1) for a main portion for explaining a wiring forming step in Embodiment 2 of the invention.

As shown in FIG. 9C, a stacked film of tantalum nitride and tantalum was deposited as a barrier metal 12 to 15 nm thickness in total by using a sputtering method, and a copper film 13 of 400 nm thickness in total was filled in the first layer wiring trenches 11 by using a sputtering method and an electrolytic plating method.

Figure 10A:
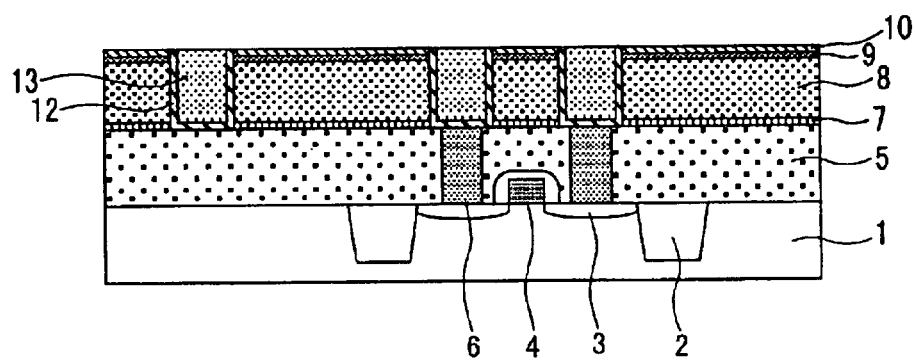
FIG. 10A is a cross sectional view (2) for a main portion for explaining a wiring forming step in Embodiment 2 of the invention.

As shown in FIG. 10A, surplus metal films other than those in the first layer wiring trenches 11 were removed in the order of the copper film 13 and the barrier metal 12 by a CMP method, to complete first layer wirings.

Then, second layer wirings were formed by a dual damascene method capable of forming inter-level connection and a wiring layer simultaneously as described below.

Figure 10B:
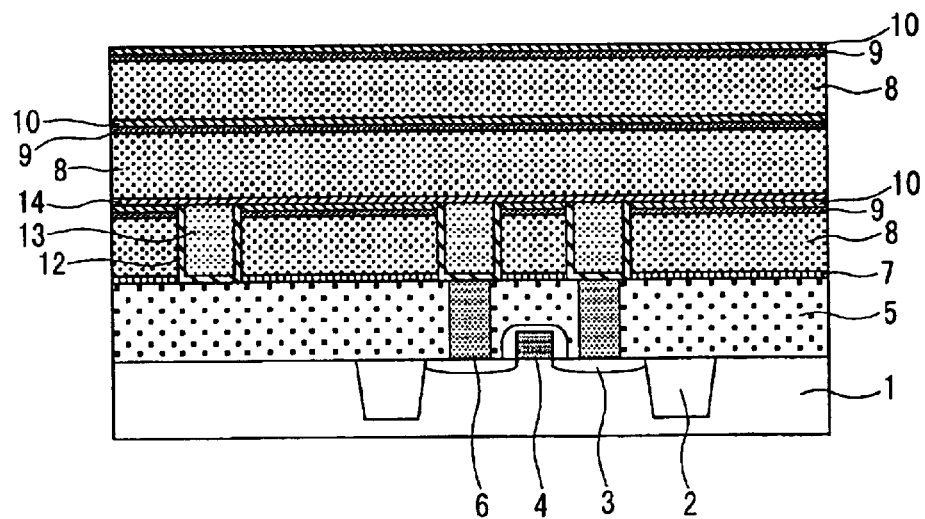
FIG. 10B is a cross sectional view (2) for a main portion for explaining a wiring forming step in Embodiment 2 of the invention.

As shown in FIG. 10B, after covering the surface of the exposed copper film 13 with a barrier dielectric film 14 of 20 nm thickness and depositing an organic siloxane film 8 of 250 nm thickness as a dielectric film of the inter-level connection layer, a modified layer 9 and a dielectric protection film 10 of the invention were formed in the same method as that in FIG. 9A. In this case, the dielectric protection film 10 has a role as an etching stopper upon forming second layer wiring trenches by dry etching. Then, deposition of the organic siloxane film 8 of 200 nm thickness as the dielectric film for the second wiring area, the modified layer 9 and the dielectric protection film 10 of the invention were deposited repeatedly.

Figure 11A:
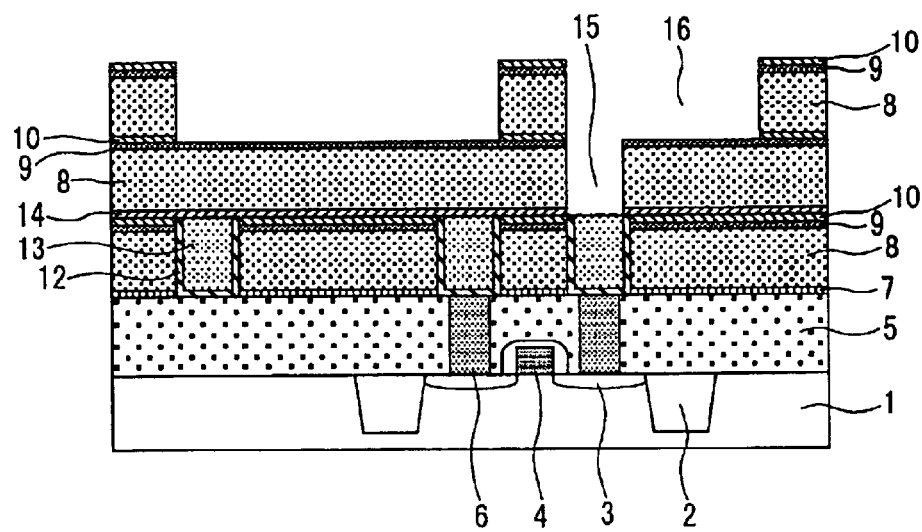
FIG. 11A is a cross sectional view (3) for a main portion for explaining a wiring forming step in Embodiment 2 of the invention.

Successively, as shown in FIG. 11A, a via hole 15 and second layer wiring trenches 16 were formed by repeating formation of a resist pattern, dry etching and removal of a resist pattern.

Figure 11B:
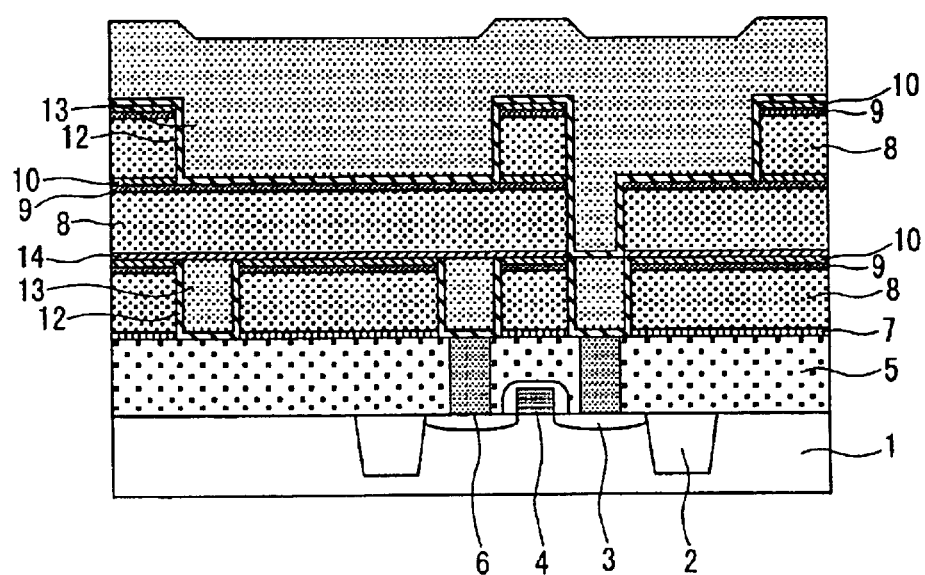
FIG. 11B is a cross sectional view (3) for a main portion for explaining a wiring forming step in Embodiment 2 of the invention.

Further, as shown in FIG. 11B, a barrier metal 12, and a copper film 13 were filled simultaneously in the via hole 15 and the second layer wiring trench 16 by the same method as that for FIG. 9C.

Figure 12A:
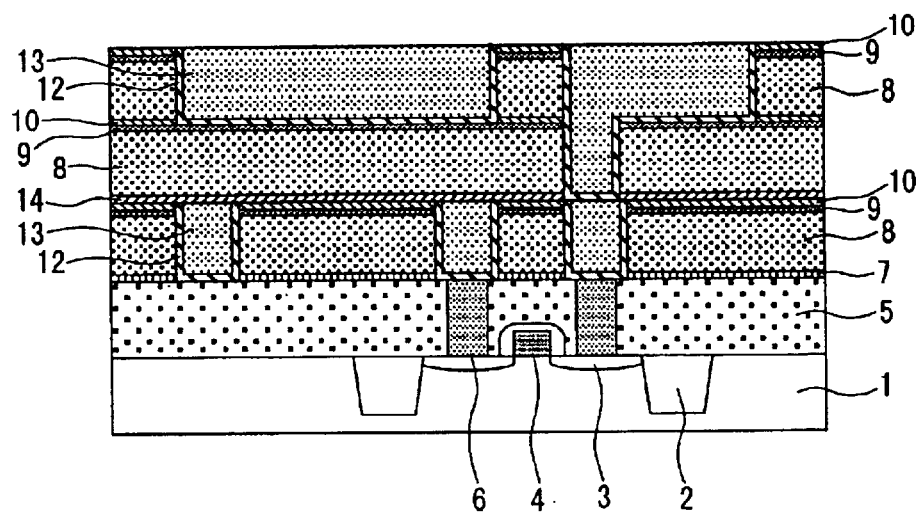
FIG. 12A is a cross sectional view (4) for a main portion for explaining a wiring forming step in Embodiment 2 of the invention.

Finally, surplus metal film other than that in the second layer wiring trench 16 was removed by a CMP method to complete second layer wirings (FIG. 12A).

Figure 12B:
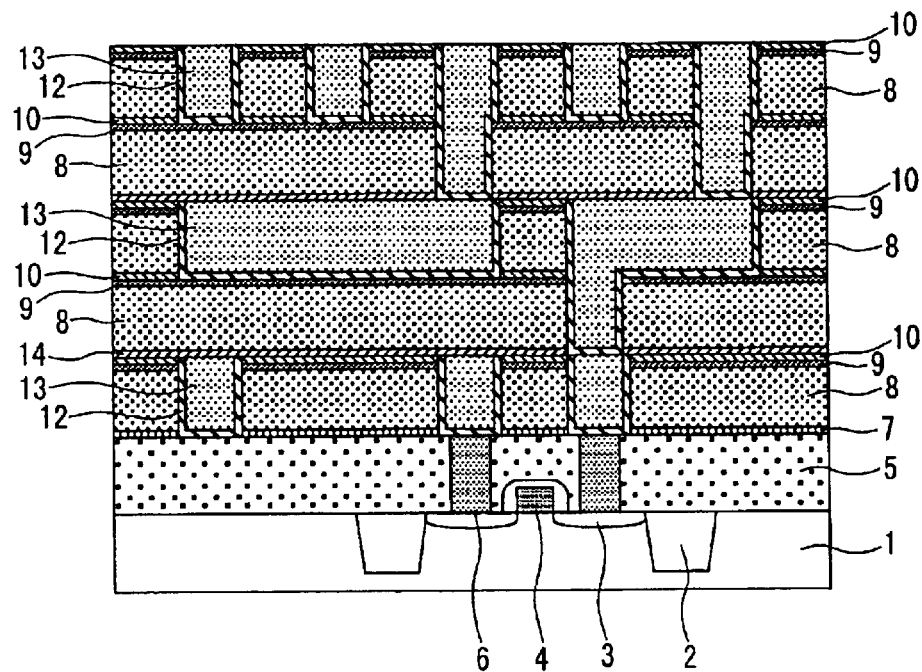
FIG. 12B is a cross sectional view (4) for a main portion for explaining a wiring forming step in Embodiment 2 of the invention.

Then, as shown in FIG. 12B, third layer wirings were formed by repeating the same steps as those for the second layer wirings.

Figure 13:
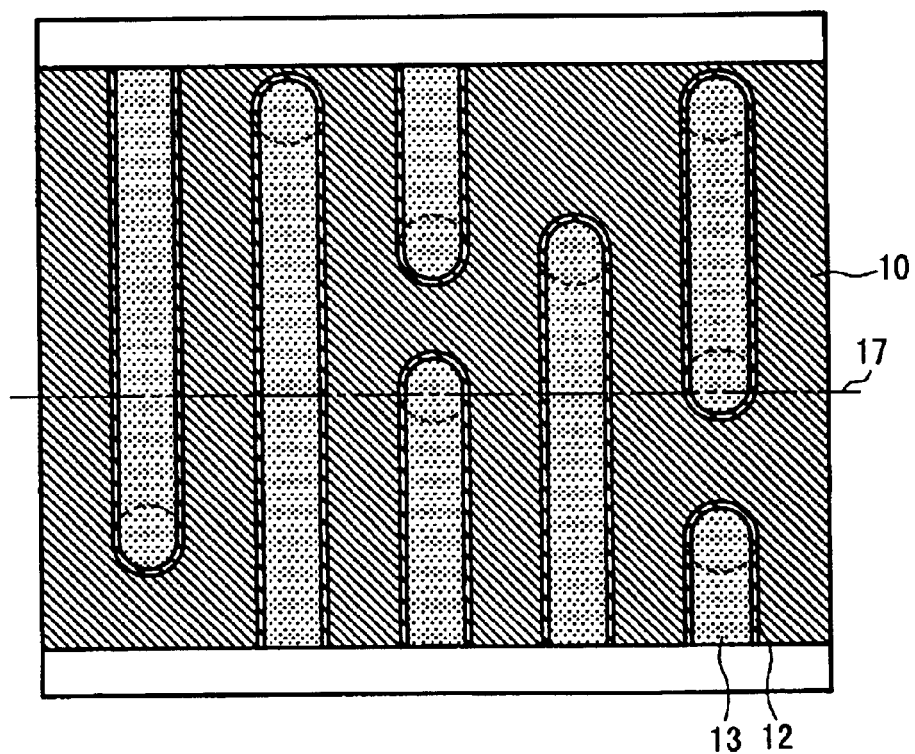
FIG. 13 is an upper plan view for a main portion for explaining a wiring forming step in Embodiment 2 of the invention.

FIGS. 9 to 12 described above show cross sectional views for the wiring forming steps. FIG. 13 shows an upper plan view of FIG. 12B for easy understanding of a three-dimensional structure. The third layer wirings comprising the barrier metal 12 and the copper film 13 are arranged in parallel with each other being surrounded with the dielectric protection film 10. Reference numeral 17 indicates a cutting line corresponding to the cross sectional view of FIG. 12B. The first layer wirings are in parallel with the third layer wirings and the second layer wirings are arranged orthogonal to the third layer wirings in which wirings for the layers adjacent vertical to each other cross to each other.

Figure 14:
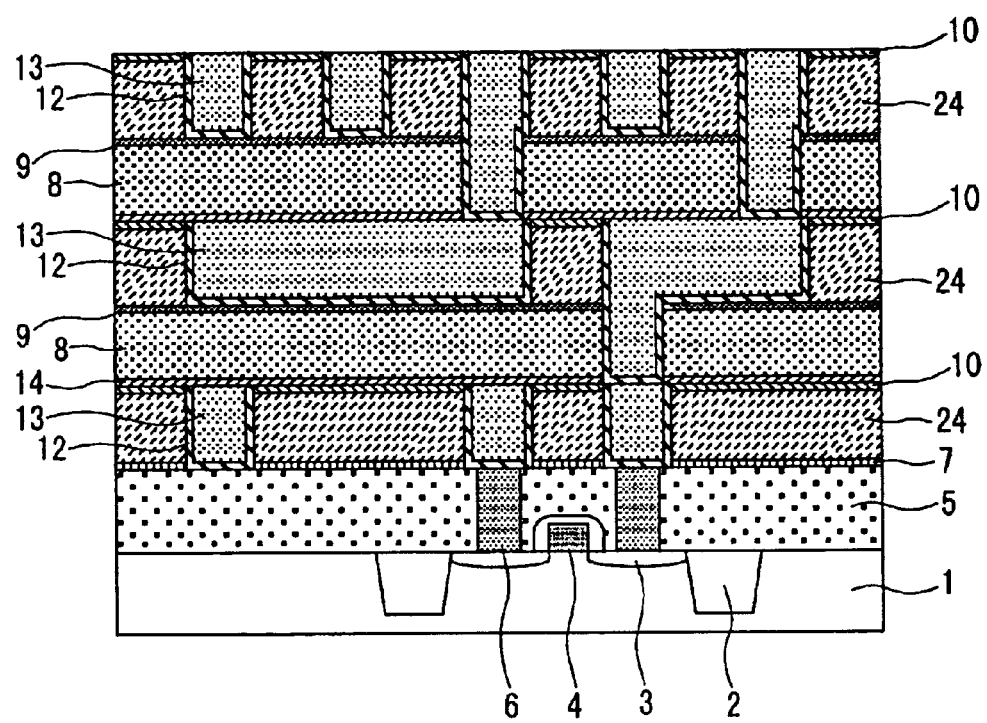
FIG. 14 is a cross sectional view for a main portion for explaining a modified example of a wiring forming step in Embodiment 2 of the invention.

FIG. 14 shows an example of a modified example of wiring forming steps shown FIGS. 9 to 13, using an organic siloxane film as the dielectric film for the inter-level connection layer, and an aromatic polymer film as the dielectric film for the wiring layer. For forming the second layer wirings, after forming an organic siloxane film to 250 nm thickness, a modified layer 9 of the invention is formed, on which an organic siloxane film 24 is formed to 200 nm thickness. After depositing an dielectric protection film 9 to 20 nm thickness further thereon, wiring trenches and holes are formed by the method shown in FIGS. 9 to 13 and metals are filled therein. Third layer wirings are formed also in the same manner. In the steps, a problem of delamination between the modified layer 9 and the aromatic polymer film 24 did not occur.

The problem of delamination between the modified layer 9 and the dielectric protection film 10 of the invention was not caused throughout the wiring forming steps. Further, it has been confirmed by actual measurement of the inter-wiring capacitor that the dielectric constant of the organic siloxane film 8 including the modified layer 9 of the invention was not increased.

Further, throughout the wiring forming steps described above; when the modified layer was not formed on the surface of the organic siloxane film 8, delamination of the dielectric protection film 10 was caused mainly in the metal film removing step by the CMP method.

Further, throughout the wiring forming steps described above, when the modified layer was formed by the plasma treatment, for example, with oxygen and helium gases on the surface of the organic siloxane film 8, it has been confirmed that the dielectric constant of the organic siloxane film 8 increased and the inter-wiring capacitance also increased although the delamination was not caused.

Embodiment 3

Multi-layered wirings for a semiconductor device were prepared by dry etching of an aluminum alloy by using the method of Embodiment 1. Embodiment 3 is to be described with reference to FIGS. 15 to 19.

Figure 15A:
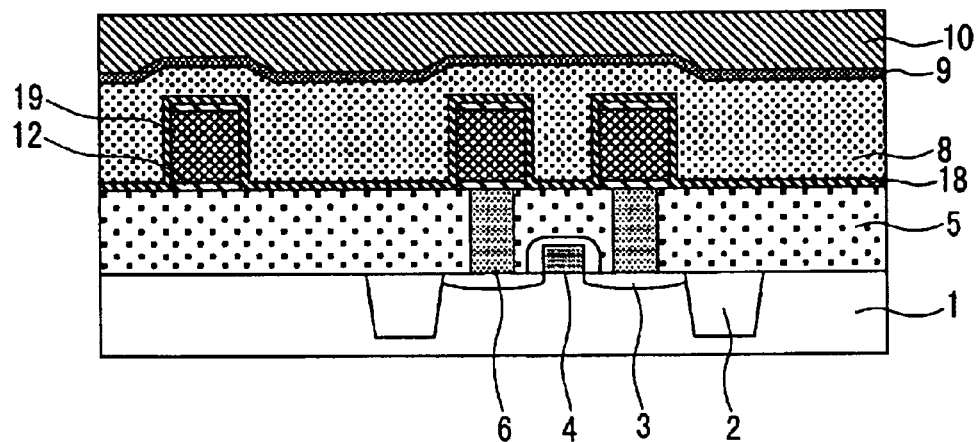
FIG. 15A is a cross sectional view (1) for a main portion for explaining a wiring forming step in Embodiment 3 of the invention.

As shown in FIG. 15A, on a silicon substrate 1, were formed an element isolation structure 2, an impurity diffusion layer 3, a gate electrode 4, a first inter-level dielectric film 5 and a contact plug 6. A barrier metal 12 of 30 nm thickness, an aluminum alloy film 19 of 250 nm thickness, and a barrier metal 12 of 30 nm thickness were formed on them in this order by a sputtering method. A titanium nitride film was used as the barrier metal film 12. After fabricating the metal films by using a resist pattern and dry etching, the resist was removed to form first layer wirings. Successively, a third inter-level dielectric film 18 of 30 nm thickness and an organic siloxane film 8 of 400 nm thickness were deposited so as to cover the first layer wirings. Further, a modified layer 9 of the invention was formed on the surface of the organic siloxane film under the conditions shown in Embodiment 1. Successively, after depositing a dielectric protection film 10 comprising a silicon oxide film to 600 nm thickness by a plasma CVD method in the same plasma apparatus as that used for forming the modified layer 9, the dielectric protection film 10 corresponding to 30 nm was scraped off to conduct planarization by a CMP method.

Figure 15B:
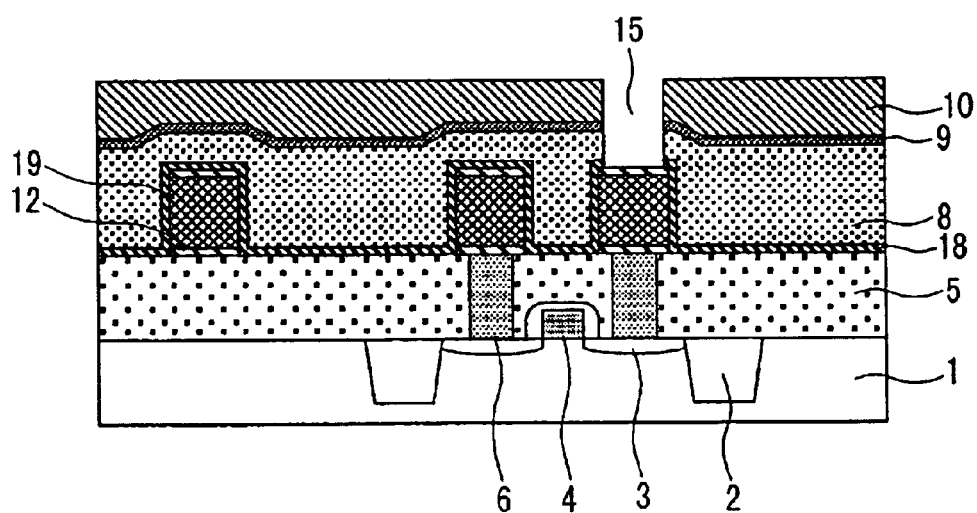
FIG. 15B is a cross sectional view (1) for a main portion for explaining a wiring forming step in Embodiment 3 of the invention.

Then, as shown in FIG. 15B, after fabrication by using a resist pattern and dry etching, the rest was removed to form a via hole 15.

Figure 16A:
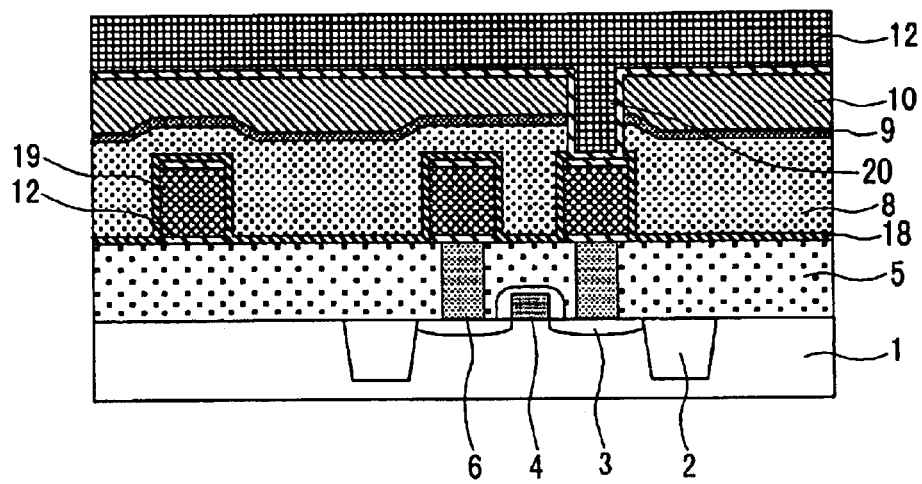
FIG. 16A is a cross sectional view (2) for a main portion for explaining a wiring forming step in Embodiment 3 of the invention.

Successively, as shown in FIG. 16A, a barrier metal 12 comprising a titanium nitride film of 30 nm and a tungsten film 20 of 300 nm thickness were deposited respectively by a CVD method to fill a via hole 15.

Figure 16B:
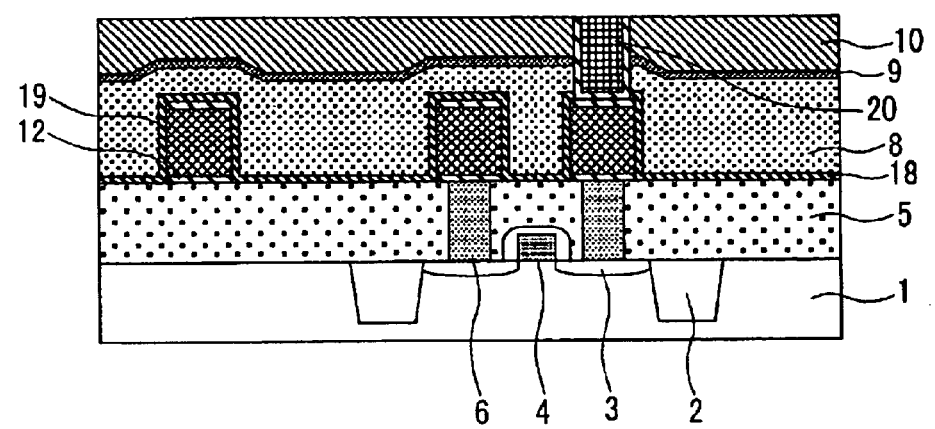
FIG. 16B is a cross sectional view (2) for a main portion for explaining a wiring forming step in Embodiment 3 of the invention.

Subsequently, as shown in FIG. 16B, surplus metal film other than that in the via hole 15 was removed by a CMP method.

The steps after the second layer wirings are identical with the steps for forming the first layer wirings.

Figure 17A:
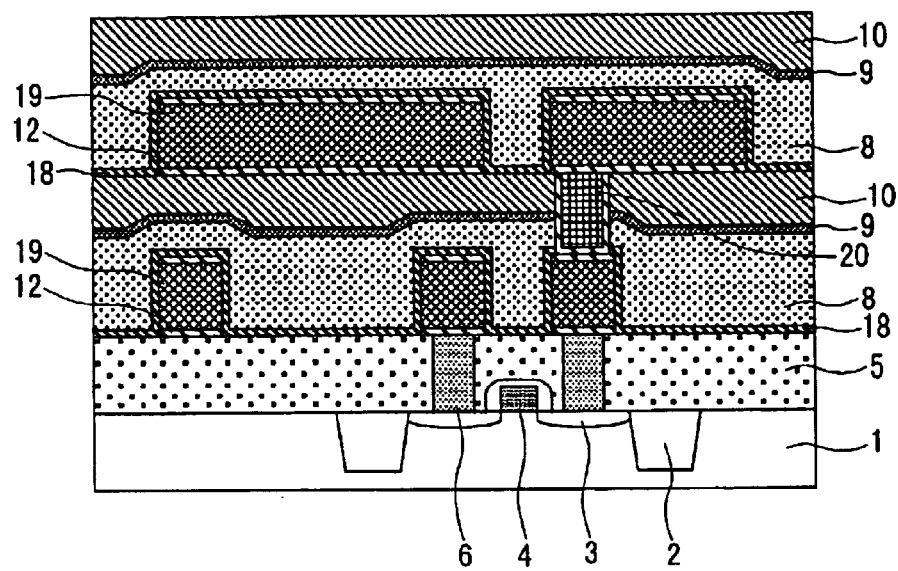
FIG. 17A is a cross sectional view (3) for a main portion for explaining a wiring forming step in Embodiment 3 of the invention.

As shown in FIG. 17A, a third dielectric film 18, an organic siloxane film 8 and a modified layer. 9 and a dielectric protection film 10 of the invention were formed in this order on the second layer wirings comprising the barrier metal 12 and the aluminum alloy film 19.

Figure 17B:
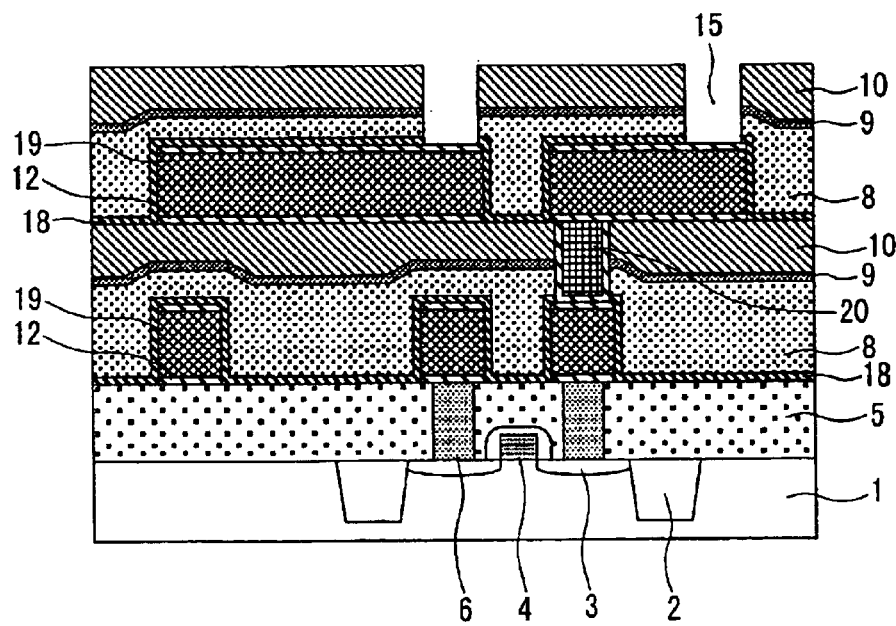
FIG. 17B is a cross sectional view (3) for a main portion for explaining a wiring forming step in Embodiment 3 of the invention.
Figure 18A:
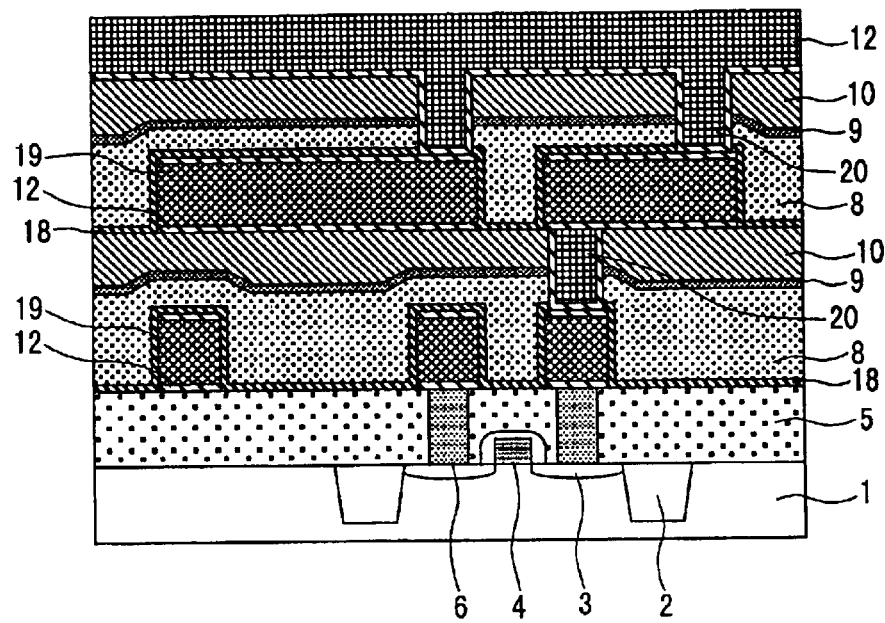
FIG. 18A is a cross sectional view (4) for a main portion for explaining a wiring forming step in Embodiment 3 of the invention.
Figure 18B:
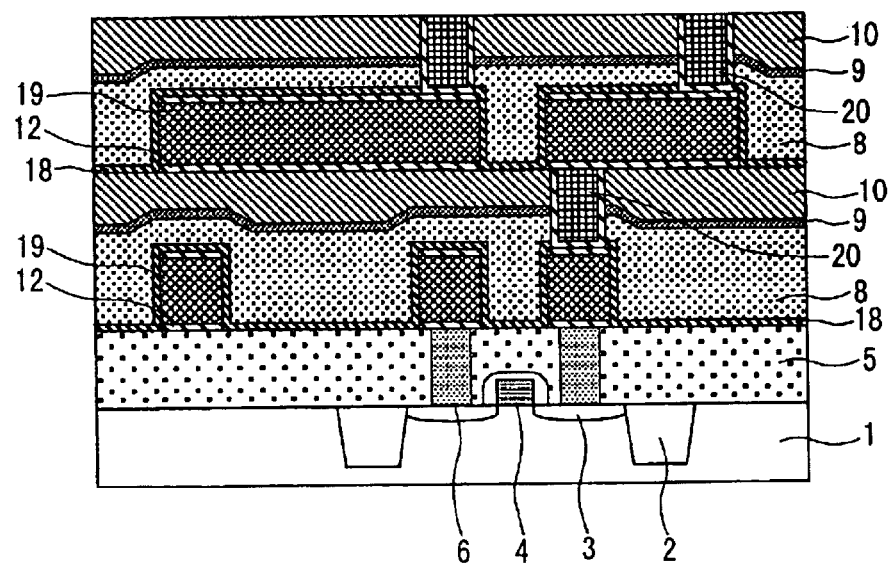
FIG. 18B is a cross sectional view (4) for a main portion for explaining a wiring forming step in Embodiment 3 of the invention.

As shown in FIG. 17B, via holes 15 were formed and, after depositing a barrier metal 12 and a tungsten film 20, as shown in FIG. 18A, surplus metal films other than those in the via holes 15 were removed as shown in FIG. 18B.

Figure 19:
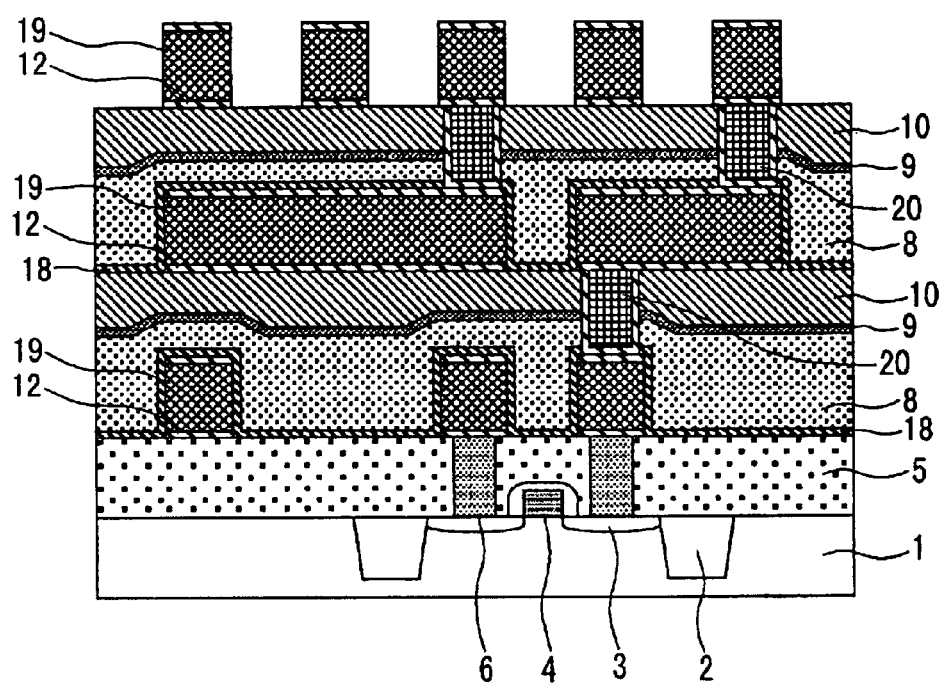
FIG. 19 is a cross sectional view (5) for a main portion for explaining a wiring forming step in Embodiment 3 of the invention.

Further, as shown in FIG. 19, third layer wirings comprising a barrier metal 12 and an aluminum alloy film 19 were formed.

Throughout the wiring forming steps described above, a problem of delamination between the modified layer 9 and the dielectric protection film 10 of the invention was not caused. Further, it has been confirmed by actual measurement of the inter-wiring capacitance that the dielectric constant of the organic siloxane film 8 including the modified layer 9 of the invention was not increased.

Further, throughout the wiring forming steps described above, when the modified layer was not formed on the surface of the organic siloxane film 8, delamination was caused frequently to the dielectric protection film 10 mainly in the metal film removing step by the CMP method.

Further, throughout the wiring forming steps described above, when the modified layer was formed by the plasma treatment with the oxygen and helium gases, it has been confirmed that, although the problem of defoliation was not caused, dielectric constant of the organic siloxane film 8 was increased and the inter-wiring capacitance was increased as well.

As has been described above, according to the present invention, adhesivity of the organic siloxane film with the dielectric protection film can be improved without increasing the dielectric constant of the siloxane film to prevent delamination.

Further, a device operating at a high speed can be attained by using an organic siloxane film of low dielectric constant as the inter-level dielectric film material for wirings.

What is claimed is:

1. A semiconductor device having a dielectric film of a stacked structure, formed on a semiconductor substrate, comprising a low dielectric constant film containing silicon, oxygen and carbon and having a dielectric constant of 3 or less; a modified layer formed on the surface of the low dielectric constant film for the low dielectric constant film containing silicon, oxygen, carbon and fluorine, and a dielectric protection film formed on the modified layer.

2. A semiconductor device according to claim 1, wherein the low dielectric constant film contains $1/10$ or more of silicon at an atomic ratio.

3. A semiconductor device according to claim 2, wherein the low dielectric constant film further contains carbon by $1/10$ or more of silicon.

4. A semiconductor device according to claim 2, wherein the low dielectric constant film further contains methyl groups by $1/10$ or more of silicon.

5. A semiconductor device according to claim 1, wherein the carbon content in the modified layer has an atomic distribution in the direction of the depth such that it is at a lower concentration on the side of the dielectric protection film and at a higher concentration on the side of the low dielectric constant film, and the carbon content in the modified layer at the interface with the dielectric protection film is $1/4$ or more of the carbon content in the low dielectric constant film.

6. A semiconductor device according to claim 1, wherein the dielectric protection film is a film of a single layer selected from a silicon carbide film, a silicon carbonitride film, a silicon oxide film, a silicon oxynitride film, a silicon carbide film, a silicon nitride film and an aluminum oxide film, or a stacked layer of plural films comprising plural films described above.

7. A semiconductor device according to claim 1, wherein the dielectric protection film is an aromatic organic polymer film.

* * * * *